(12) United States Patent
Kacker et al.

(10) Patent No.: US 9,099,458 B2
(45) Date of Patent: Aug. 4, 2015

(54) CONSTRUCTION OF RELIABLE STACKED VIA IN ELECTRONIC SUBSTRATES—VERTICAL STIFFNESS CONTROL METHOD

(75) Inventors: Karan Kacker, Atlanta, GA (US); Douglas O. Powell, Endicott, NY (US); David L. Questad, Hopewell Junction, NY (US); David J. Russell, Owego, NY (US); Sri M. Sri-Jayantha, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 278 days.

(21) Appl. No.: 13/539,480

(22) Filed: Jul. 1, 2012

(65) Prior Publication Data

US 2012/0267158 A1    Oct. 25, 2012

Related U.S. Application Data

(62) Division of application No. 12/020,534, filed on Jan. 26, 2008, now Pat. No. 8,258,410.

(51) Int. Cl.
| | |
|---|---|
| *H05K 1/11* | (2006.01) |
| *H05K 1/09* | (2006.01) |
| *H01L 23/498* | (2006.01) |
| *H05K 3/46* | (2006.01) |
| *H05K 1/02* | (2006.01) |

(52) U.S. Cl.
CPC .... *H01L 23/49827* (2013.01); *H01L 23/49838* (2013.01); *H05K 1/116* (2013.01); *H05K 3/4602* (2013.01); *H01L 2224/16* (2013.01); *H01L 2924/15311* (2013.01); *H05K 1/0271* (2013.01); *H05K 2201/0347* (2013.01); *H05K 2201/096* (2013.01); *H05K 2201/0959* (2013.01); *H05K 2201/0969* (2013.01); *H05K 2201/09454* (2013.01); *H05K 2201/09536* (2013.01); *Y10T 29/49155* (2015.01)

(58) Field of Classification Search
CPC ............ H01L 23/49827; H01L 21/486; H01L 21/76877; H01L 21/76879; H01L 23/5226; H05K 1/115; H05K 3/0094; H05K 3/4644; H05K 7/023
USPC .................. 174/257, 261–266; 361/792–795
See application file for complete search history.

(56) References Cited

U.S. PATENT DOCUMENTS

| | | | |
|---|---|---|---|
| 6,298,551 B1 * | 10/2001 | Wojnarowski et al. | 29/829 |
| 2008/0083560 A1 * | 4/2008 | Saiki et al. | 174/255 |

* cited by examiner

*Primary Examiner* — Dion R Ferguson
(74) *Attorney, Agent, or Firm* — Tutunjian & Bitetto, P.C.; Vazken Alexanian

(57) ABSTRACT

A stacked via structure for reducing vertical stiffness includes: a plurality of stacked vias, each via disposed on a disc-like structure. The disc-like structure includes a platted through hole landing supporting the plurality of stacked vias. The platted through hole landing includes an etched pattern.

13 Claims, 9 Drawing Sheets

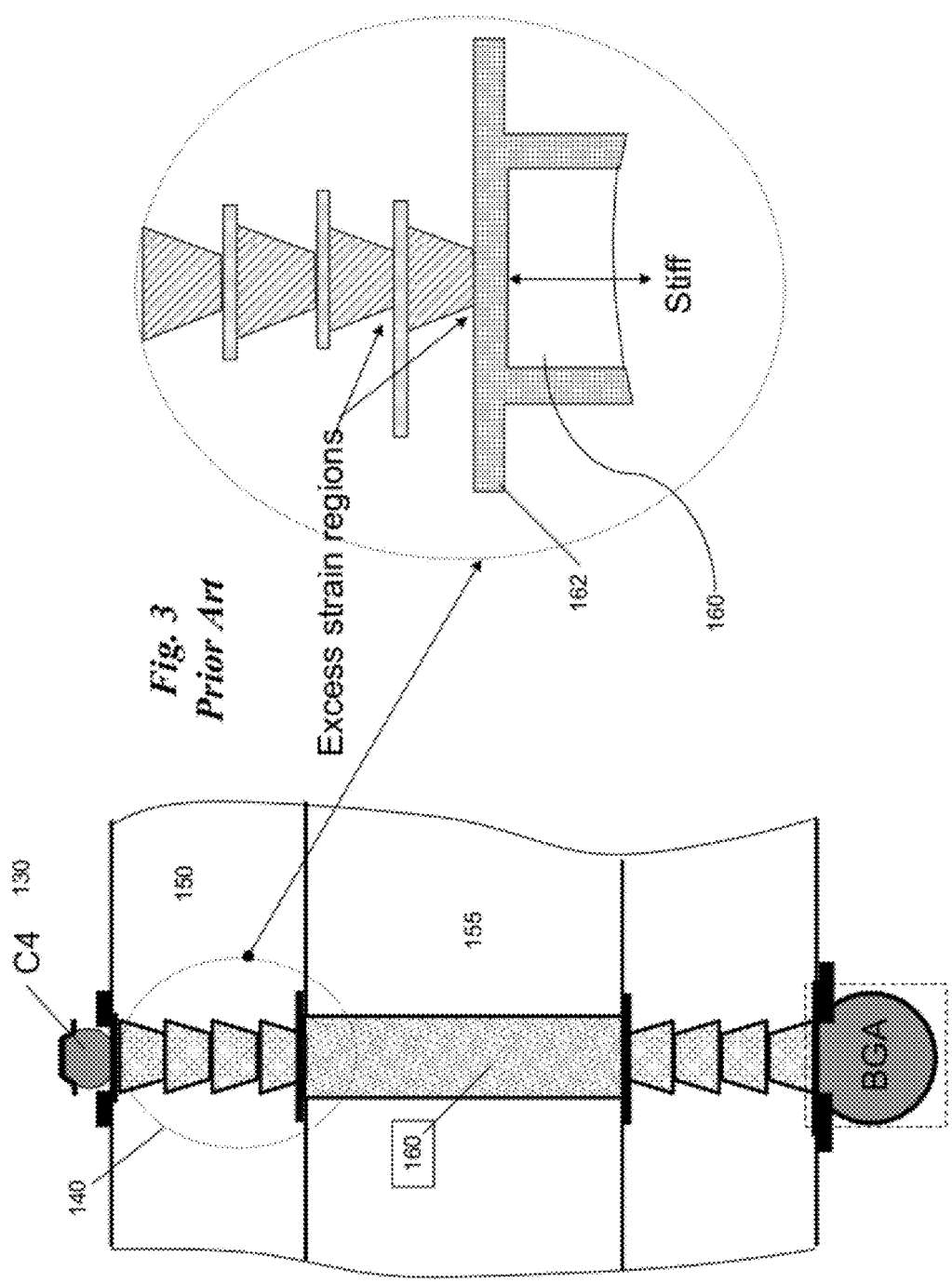

Prior art — Hard PTH Landing
Cumulative Strain = 1.7%

Invention — Soft PTH Landing
Cumulative Strain = 1.3%

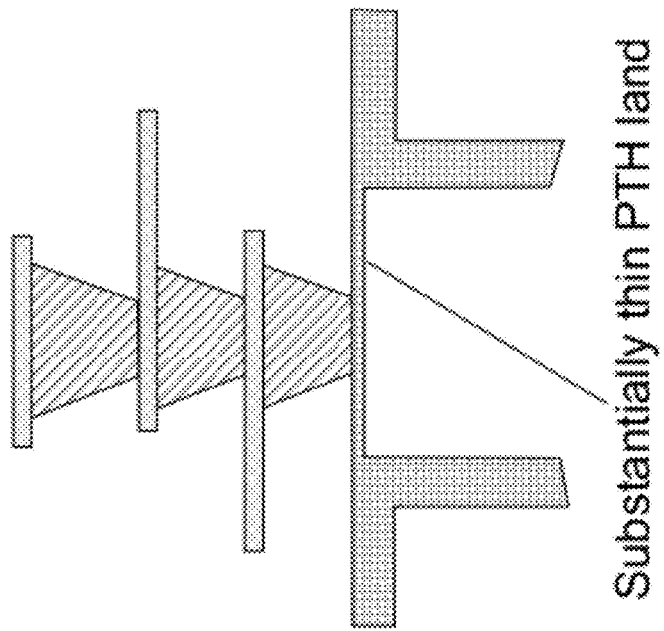
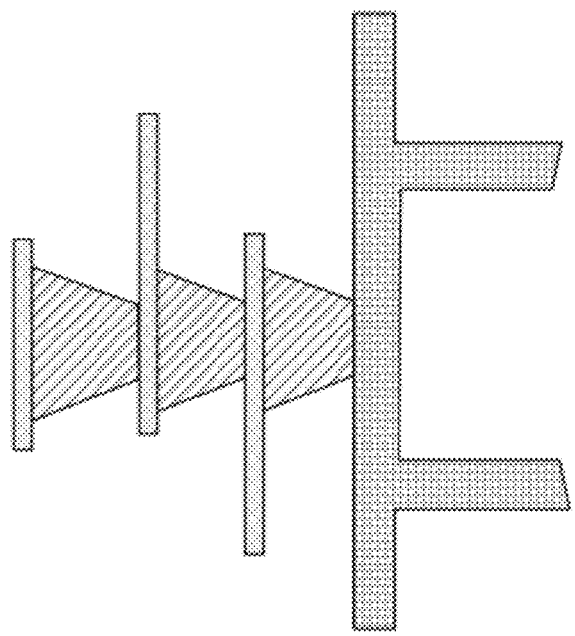
FIG. 7

PTH Cap is Removed

PTH Cap Present

Deformations Magnified by X30

CONSTRUCTION OF RELIABLE STACKED VIA IN ELECTRONIC SUBSTRATES—VERTICAL STIFFNESS CONTROL METHOD

CROSS-REFERENCE TO RELATED APPLICATIONS

This application is a division of, and claims priority to, commonly-owned and co-pending application filed under U.S. Ser. No. 12/020,534, filed on Jan. 26, 2008; and contains material similar to that disclosed in commonly-owned, co-pending applications.

STATEMENT REGARDING FEDERALLY SPONSORED-RESEARCH OR DEVELOPMENT

None.

INCORPORATION BY REFERENCE OF MATERIAL SUBMITTED ON A COMPACT DISC

None.

FIELD OF THE INVENTION

The invention disclosed broadly relates to the field of chip design and more particularly relates to the field of electronic substrates in chip design.

BACKGROUND OF THE INVENTION

Integrated circuits (chips) are generally made of silicon on which electronic circuits are fabricated. These chips are placed on substrates. A substrate is made of organic materials embedded with copper interconnects. The substrate helps to join the chip to external circuits on a motherboard. FIG. 1a shows a cross-section of a chip 110 on a substrate 120. These are the two key components of an electronic module.

FIG. 2 shows a cross-section of the substrate 120. The density of connection points (controlled collapse chip connect, or C4s) 130 between the chip 110 and the substrate 120 is a critical parameter. An increased number of C4s 130 requires multiple buildup layers 150 to facilitate electrical connections to the external motherboard. Buildup layers 150 are fabricated in stages on the top and bottom of a fiber reinforced core 155.

FIG. 2 shows stacked vias 140 as well as staggered vias 145 needed to complete the interconnection. Stacked vias 140 help achieve more than 20% connection density compared to a staggered via 145. FIG. 3 shows a conventional stacked via 140 and a platted through hole (PTH) 160. A PTH 160 allows electrical connectivity between the top and bottom buildup layers.

The coefficient of thermal expansion (CTE) of various materials used to construct a module is not matched and is known to drive thermomechanical stresses within a module. Repeated thermal cycling of an electronic module exhibits failure at via interface regions due to thermomechanically driven accumulated strain.

There is a need for a system to reduce thermomechanical stresses on electronic modules.

SUMMARY OF THE INVENTION

Briefly, according to an embodiment of the invention a stacked via structure for reducing vertical stiffness includes: a plurality of stacked vias. Each via is disposed on a disc-like structure which includes a platted through-hole landing. The platted through-hole landing: a multi-part compliant center zone; and spring-like stiffness-reducing connectors for connecting parts of the multi-part compliant center zone of the platted through hole landing. The compliant center zone includes: an outer zone; an intermediate zone; and a center zone. The three zones are electrically conducting and mechanically facilitates the compliant center zone.

In another embodiment of the present invention, a substrate via structure includes: a plurality of stacked vias. Each via is disposed on a disc-like structure including: an etched platted-through landing. The disc-like structure may be etched with a spoke-like pattern. The etched pattern may be concentric circles. The concentric circles may form a gimbal pattern.

Further, the platted through-hole landing may have a thickness of substantially 3 µm. This thickness is achieved by controlled grinding of the copper top surface of the platted through-hole landing.

BRIEF DESCRIPTION OF THE DRAWINGS

To describe the foregoing and other exemplary purposes, aspects, and advantages, we use the following detailed description of an exemplary embodiment of the invention with reference to the drawings, in which:

FIG. 3 shows a close-up view of stacked vias and an exploded view of the stacked vias and the platted through hole;

FIG. 7 shows a PTH landing with substantially reduced thickness, according to an embodiment of the present invention;

Figure 2:
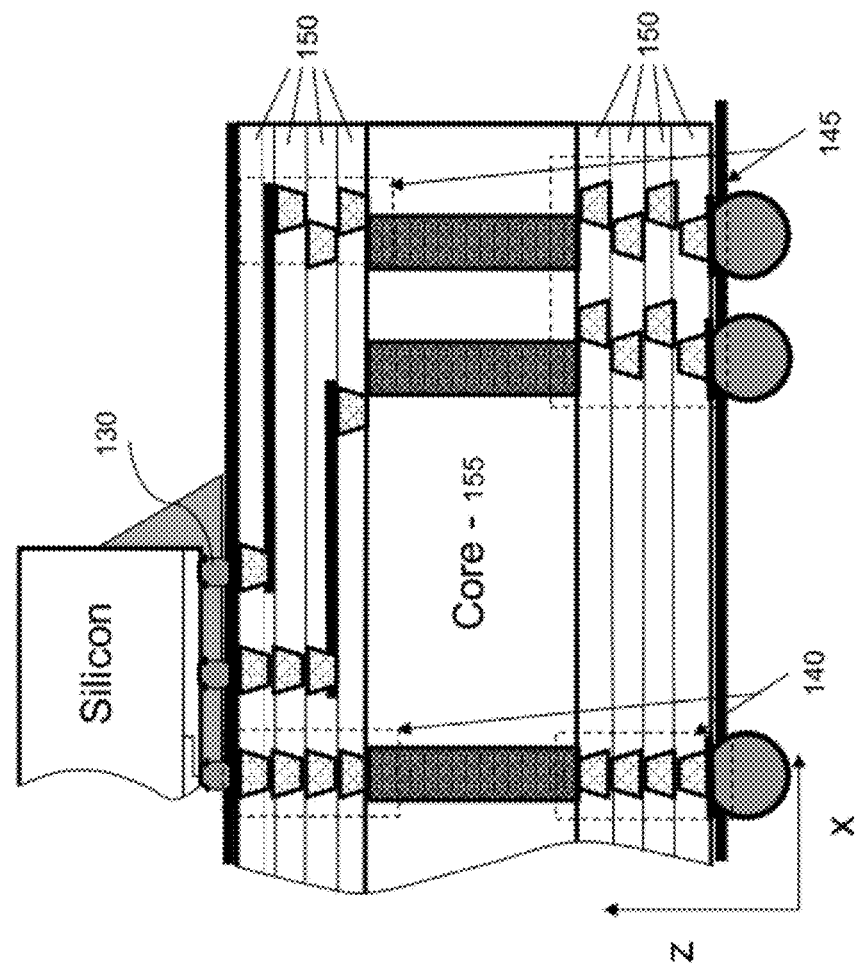
FIG. 2 shows a cross-section of the substrate, indicating the stacked and staggered vias, according to the known art.
Figure 1A:
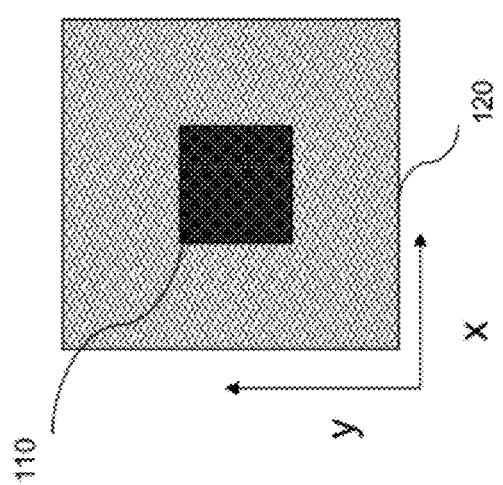
FIG. 1 shows a cross-section of the two key components of an electronic module, a chip and a substrate, according to the known art.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

Embodiments of the present invention relate to a stacked via structure for electronic substrates such that the thermomechanical stresses on the vias are reduced. This stacked via structure reduces the vertical stiffness inherent in current via structures. Referring to FIG. 4a there is shown an optimized configuration for chip modules, according to the known art. The vias of FIG. 4a (Via1) 140 are built on the platted through hole (PTH) landing 162 and are conventionally supported by this disc-like structure, preferably made of copper (Cu). Although other materials could be used, copper is ideal because of its electrical and thermal properties.

Each via member of the three-stack via 140 is about 20 µm thick. Because of the difference in the coefficient of thermal expansion (CTE) between copper and the build-up layers 150 which occurs during a thermal cycle (125 degrees C. to −55 degrees C.), the build-up layers 150 as shown in FIG. 3 (with a CTE of approximately 20 ppm/degrees C.) shrink much faster than the Cu-via 140 (with a CTE of approximately 16 ppm/degrees C.). As this occurs, the stacked via 140 is compressed in the Z direction against the PTH landing 162 by the surrounding build-up layers 150 as they compress.

The key advantage of a preferred embodiment of the present invention is that reducing the stiffness of the PTH landing 162 in the Z direction reduces the compression stress on the copper vias 140. This solution also allows a stacked via 140 to pitch with greater ease as its bending stiffness is reduced by the compliant PTH landing 162.

Figure 4B:
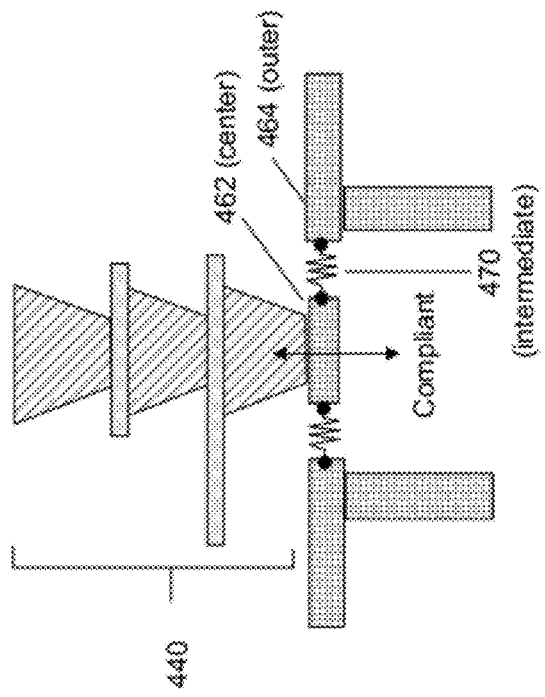
FIG. 4b shows a close-up view of stacked vias built on a soft landing, according to an embodiment of the present invention.
Figure 4A:
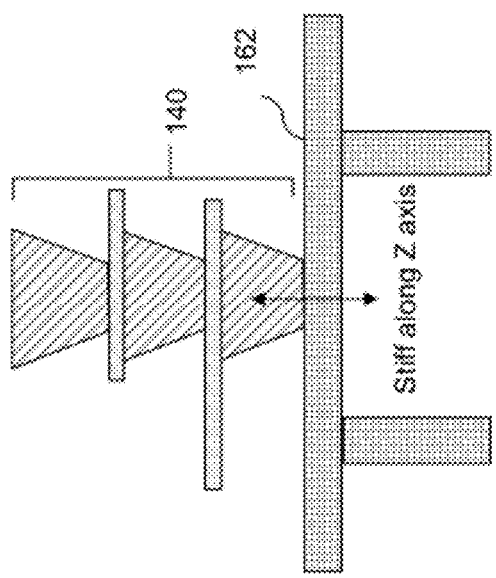
FIG. 4a shows a close-up view of stacked vias built on a platted through hole landing, according to the known art.

FIG. 4b illustrates this concept. Consider that the PTH landing 462 of FIG. 4b has three distinct zones. The inner zone 462 is a disc that supports the via stack 460, the outer zone 464 is a circular ring and the intermediate zone 470 provides the extra compliance represented by spring-like elements. These spring-like elements 470 provide compliance to the center landing 462 by allowing increased flexibility of movement when force is applied in the Z direction. The functional operation of this embodiment can be compared to that of a trampoline where the center zone is allowed to move compliantly along the Z-direction by means of springs holding the canopy along its periphery.

The compliant spring-like connectors 470 are preferably constructed from the same etching process that is employed to generate the circuit pattern on the first layer of Cu present on both sides of the core 155. The conventional disc-like structure of the PTH 462 is innovatively etched with patterns (as discussed later) so that they are electrically conducting but also mechanically compliant along the Z axis.

Figure 4C:
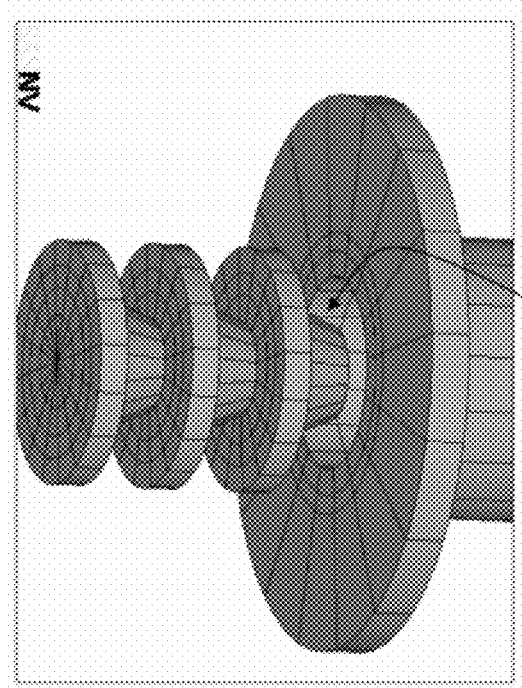
FIG. 4c shows another view of the stacked vias of FIG. 4a, according to the known art.
Figure 4D:
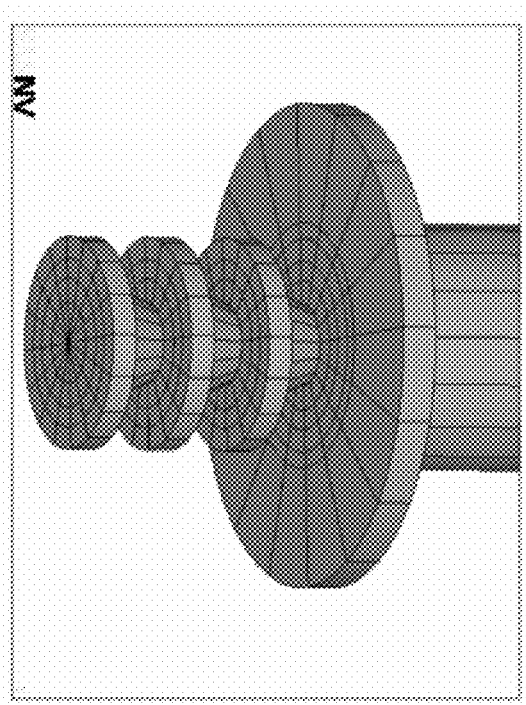
FIG. 4d shows another view of the stacked vias of FIG. 4b, according to an embodiment of the present invention.

A finite element (FE) analysis of a three-stack via configuration reveals that the cumulative strain of a conventional stacked via of 1.7% can be reduced to 1.3% (25% reduction) by providing a compliant PTH landing 462 for a stacked via 460. FIGS. 4c and 4d show the configurations used in the FE estimates.

FIG. 4c shows a schematic illustration of the stacked vias 140 of FIG. 4a.

FIG. 4d shows a schematic illustration of the stacked vias of FIG. 4b. This is the optimal structure wherein the bottom stack is completely disconnected from the PTH structure. The stiffness of this structure in the Z direction is substantially zero.

Figure 5:
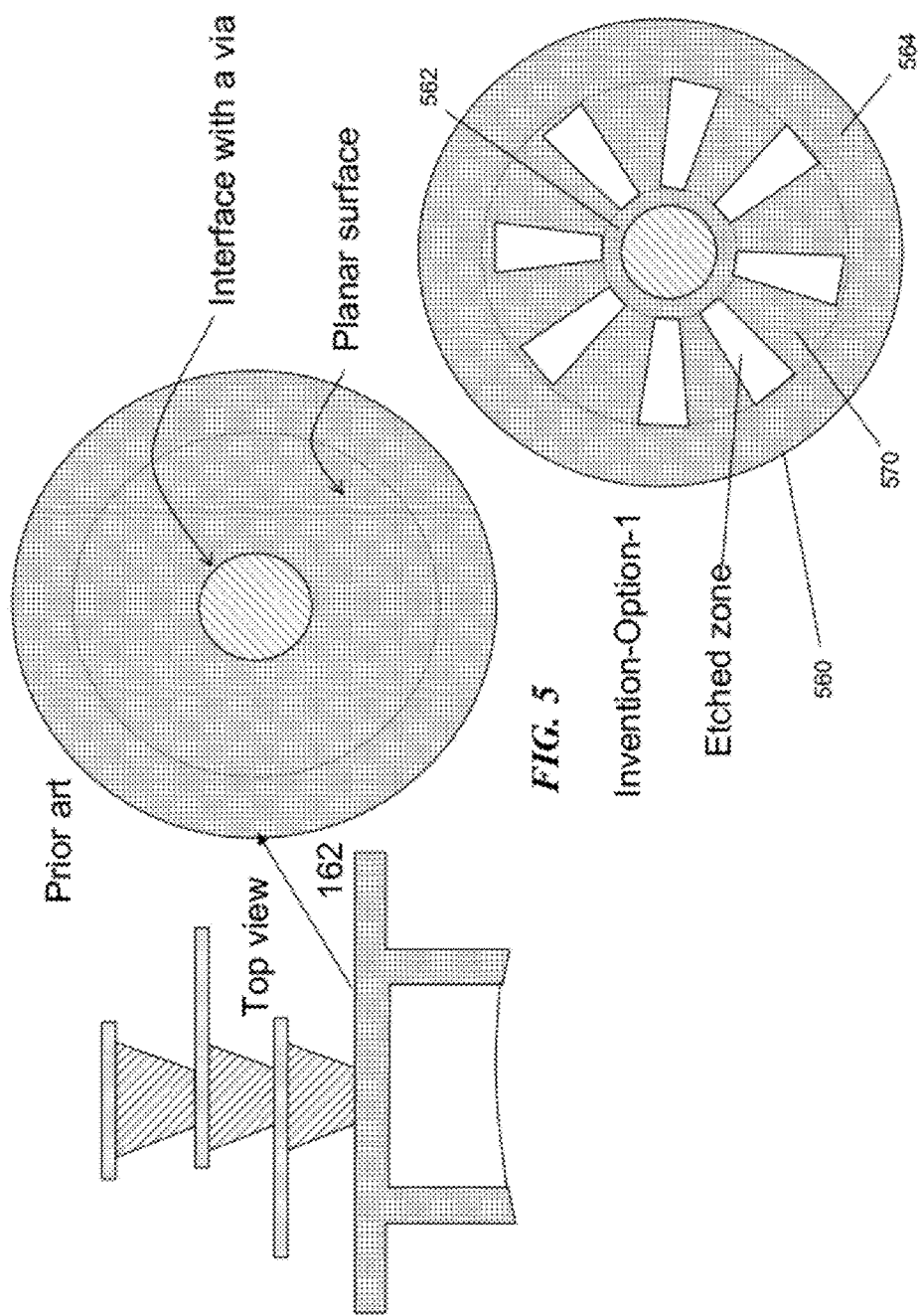
FIG. 5 shows an example of a spoke-like construction etched into the substrate layer, according to an embodiment of the present invention.

FIGS. 5, 6A, 6B, 6C, 6D, and 7 show various embodiments which also minimize the Z-stiffness of the PTH landing 560 within the scope of the present invention. FIG. 5 shows a spoke-like construction that can be achieved using the subtractive etching process used to generate the first circuit layer. Compared to a solid disc-like PTH landing 162, removal of copper material by etching (in order to form a spoke-like structure) introduces a reduction in the load carrying area of the modified PTH 560. The Z-stiffness is accordingly reduced. The three distinct zones (462, 464 and 470) discussed in FIG. 4b are identified as 562, 564 and 570 in FIG. 5 of the invention.

Figure 6A:
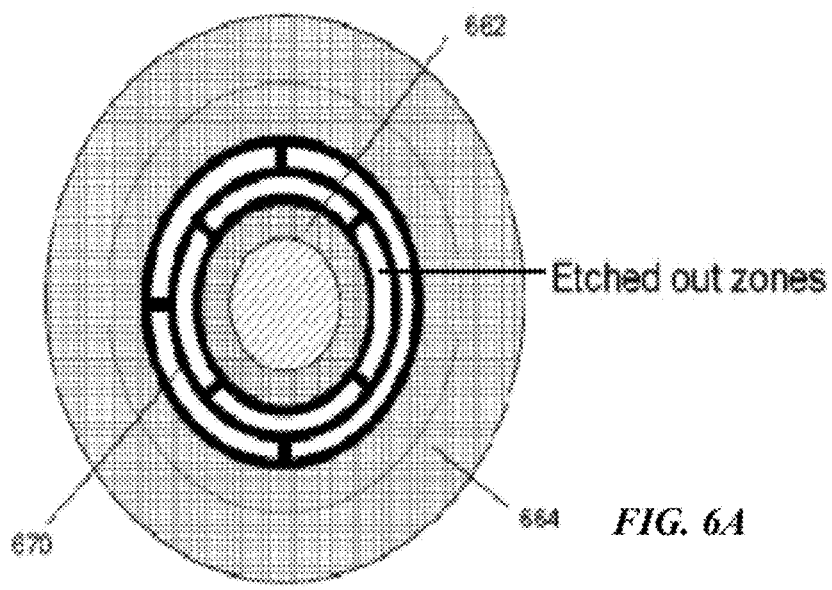
FIGS. 6A, 6B, 6C, and 6D show concentric circles connected to each other at overlapping points, according to an embodiment of the present invention.
Figure 6B:
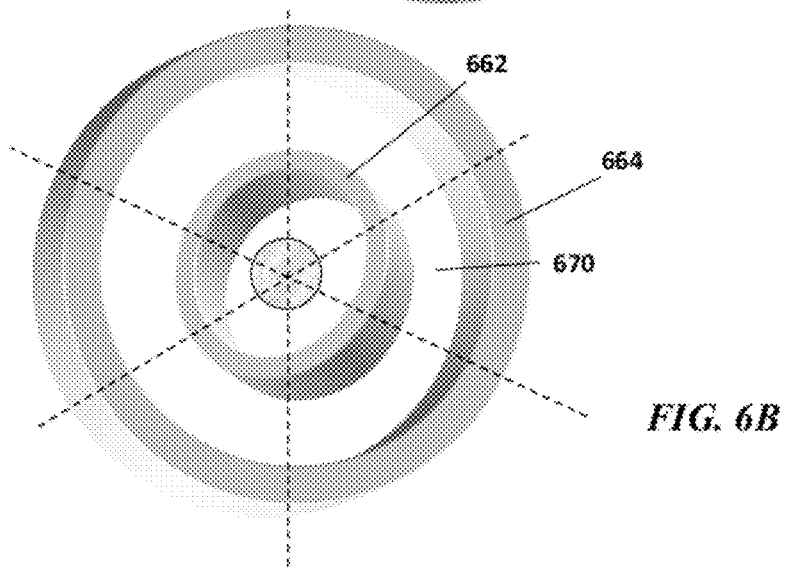
Figure 6C:
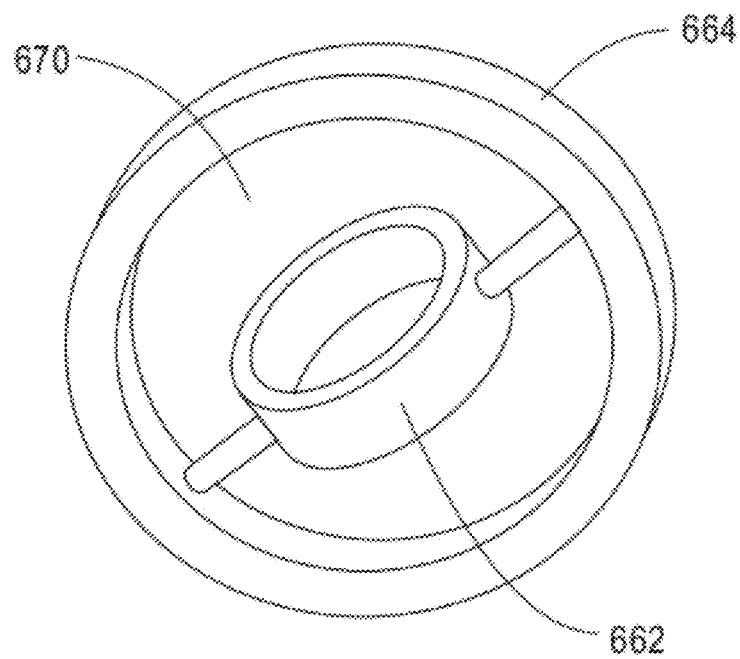
Figure 6D:
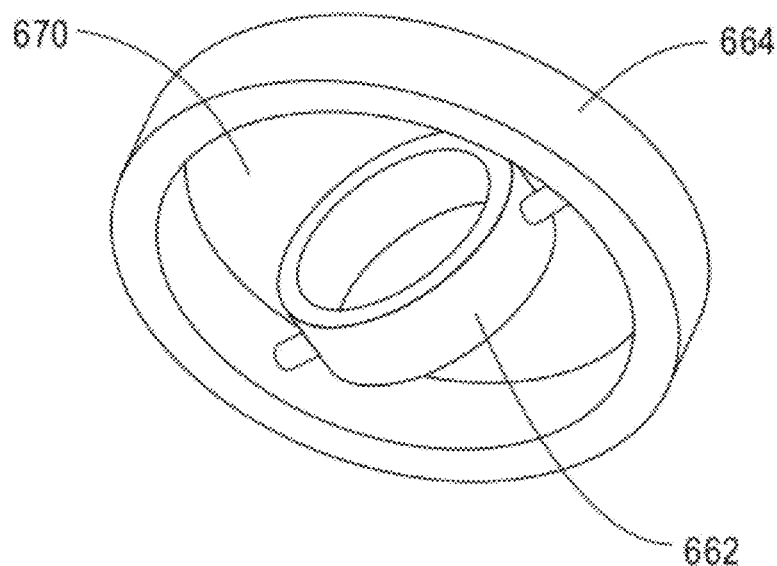

FIG. 6A shows another embodiment of the invention wherein concentric circles connected to each other at non-overlapping points are used to reduce Z-stiffness. Notice that a gimbal-like structure shown in FIG. 6B is a subset of this configuration in which the pitching stiffness can be reduced to very low levels. A gimbal has at least two rings mounted on axes which are at right angles to each other. In this embodiment, the concentric circles will be mounted at acute and/or obtuse angles in order to accommodate the via in the center, as shown in FIGS. 6C and 6D. The three distinct zones (462, 464 and 470) discussed in FIG. 4b are identified as 662, 664 and 670 in FIGS. 6A through 6D of the invention.

A multitude of Z-stiffness reducing patterns on PTH landings can be envisaged without increasing the electrical resistance of an interconnect. FIG. 7 shows a PTH landing with substantially reduced thickness (reduced from 10 um to 3 um) within the PTH region. Such a configuration is achieved by means of controlled grinding of the copper top surface. In this configuration the intermediate and center zones merge into a single zone.

Figure 8B:
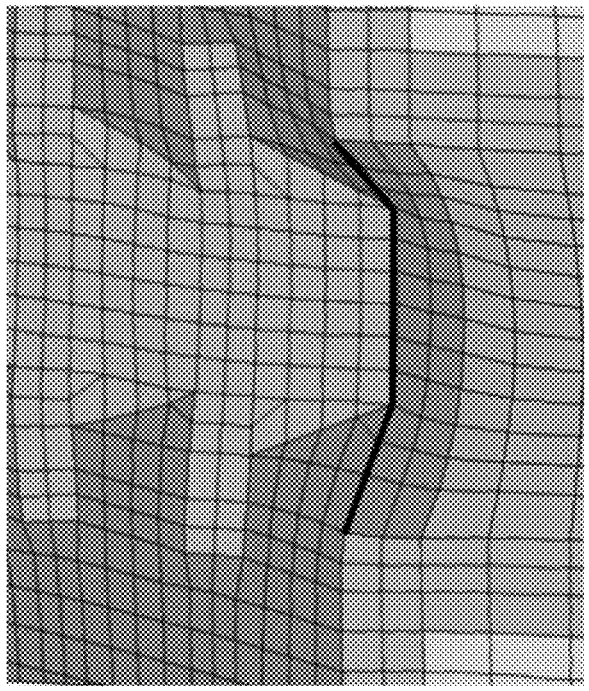
FIG. 8b shows a 30× magnification of deformation of a stacked via with the PTH cap removed.
Figure 8A:
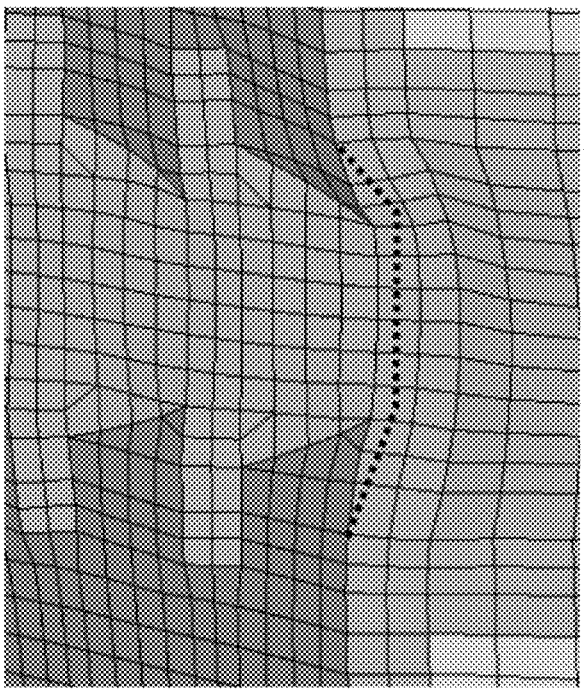
FIG. 8a shows a 30× magnification of deformation of a stacked via with a PTH cap.

FIG. 8a shows a 30× magnification of deformation of a stacked via with a PTH cap. FIG. 8b shows a 30× magnification of deformation of a stacked via with the PTH cap removed. You will note that the deformation is lessened without the PTH cap.

Therefore, while there has been described what is presently considered to be the preferred embodiment, it will be understood by those skilled in the art that other modifications can be made within the spirit of the invention.

The invention claimed is:

1. A substrate via structure for reducing vertical stiffness, the structure comprising:
    a plurality of stacked vias, wherein each via is disposed on a disc-like platted through-hole landing; and
    the plurality of platted through-hole landings, each platted through-hole landing comprising:
        an inner zone;
        an intermediate zone comprising an etched spoke-like pattern, wherein the etched spoke-like pattern includes spokes tapered toward the inner zone; and
        a solid outer zone comprising a circular ring enclosing the spoke-like pattern of the intermediate zone.

2. The substrate via structure of claim 1 wherein the disc-like platted through-hole landing is electrically conducting.

3. A method of fabricating a substrate via structure for reducing vertical stiffness, said method comprising:
    providing a plurality of disc-like platted through-hole landings, each platted through-hole landing comprising:
        an inner zone;
        an intermediate zone comprising an etched spoke-like pattern, wherein the etched spoke-like pattern includes spokes tapered toward the inner zone; and
        a solid outer zone comprising a circular ring enclosing the spoke-like pattern of the intermediate zone; and
    providing a plurality of stacked vias, wherein each via is disposed on the disc-like platted through-hole landing.

4. The method of claim 3 wherein providing the plurality of disk-like platted through-hole landings comprises providing a plurality of electrically-conducting disc-like platted through-hole landings.

5. The method of claim 3 further comprising etching the intermediate zone of the platted through-hole landing.

6. The method of claim 5 wherein etching the intermediate zone of the platted through-hole landing comprises using a subtractive etching process.

7. The method of claim 6 further comprising etching the spoke-like pattern.

8. The method of claim 3 further comprising controlled grinding of the inner zone and the intermediate zone of the platted through-hole landing.

9. The method of claim 8 wherein the controlled grinding reduces a thickness of the inner zone and the intermediate zone of the platted through-hole landing to approximately 3 µm.

10. The substrate via structure of claim 1 wherein the platted through-hole landing comprises a thickness of approximately 10 µm.

11. The substrate via structure of claim 1 wherein the inner zone and the intermediate zone of the platted through-hole landing comprises a reduced thickness of approximately 3 µm.

12. The substrate via structure of claim 1 wherein the intermediate zone is configured to provide compliance to each platted through-hole landing.

13. The substrate via structure of claim 1 wherein the plurality of platted through-hole landings comprise copper.

* * * * *